US008492925B2

(12) United States Patent
Vemulapalli et al.

(10) Patent No.: US 8,492,925 B2
(45) Date of Patent: Jul. 23, 2013

(54) APPARATUS FOR CHARGING AN EXTERNAL CAPACITOR

(75) Inventors: Gowtham Vemulapalli, Murphy, TX (US); Rakesh Raja, Allen, TX (US); Abidur Rahman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 540 days.

(21) Appl. No.: 12/862,511

(22) Filed: Aug. 24, 2010

(65) Prior Publication Data

US 2012/0049628 A1      Mar. 1, 2012

(51) Int. Cl.
*H02J 1/10* (2006.01)
(52) U.S. Cl.
USPC ............... 307/43; 307/52; 307/87; 327/110; 327/309; 327/318; 327/321; 327/322; 327/327; 327/328; 327/347; 330/253
(58) Field of Classification Search
USPC ............................................. 307/43
See application file for complete search history.

(56) References Cited

U.S. PATENT DOCUMENTS

| 5,796,278 | A | * | 8/1998 | Osborn et al. ................ 327/108 |
| 5,909,135 | A | | 6/1999 | Baldwin et al. |
| 6,441,681 | B1 | | 8/2002 | White et al. |
| 8,283,808 | B2 | * | 10/2012 | Chojecki et al. .............. 307/115 |
| 2002/0033727 | A1 | * | 3/2002 | Okamoto ..................... 327/309 |
| 2005/0068089 | A1 | | 3/2005 | Balakrishnan |
| 2009/0085615 | A1 | | 4/2009 | Balakrishnan |
| 2010/0127775 | A1 | * | 5/2010 | Tadeparthy et al. ........... 330/253 |
| 2010/0133909 | A1 | * | 6/2010 | Tadeparthy .................... 307/52 |

* cited by examiner

*Primary Examiner* — Rexford Barnie
*Assistant Examiner* — Toan Vu
(74) *Attorney, Agent, or Firm* — Alan A. R. Cooper; Wade J. Brady, III; Frederick J. Telecky, Jr.

(57) ABSTRACT

Conventional circuits often have undesirable characteristics to due "hot spots" or use a large amount of area. Here, however, a charging circuit is provides that uses an improved driver. Namely, an amplifier within a current sensor is used to control the rate that a switch can charge an external capacitor. This is accomplished through the adjustment of the gain of the amplifier during a charging mode.

22 Claims, 4 Drawing Sheets

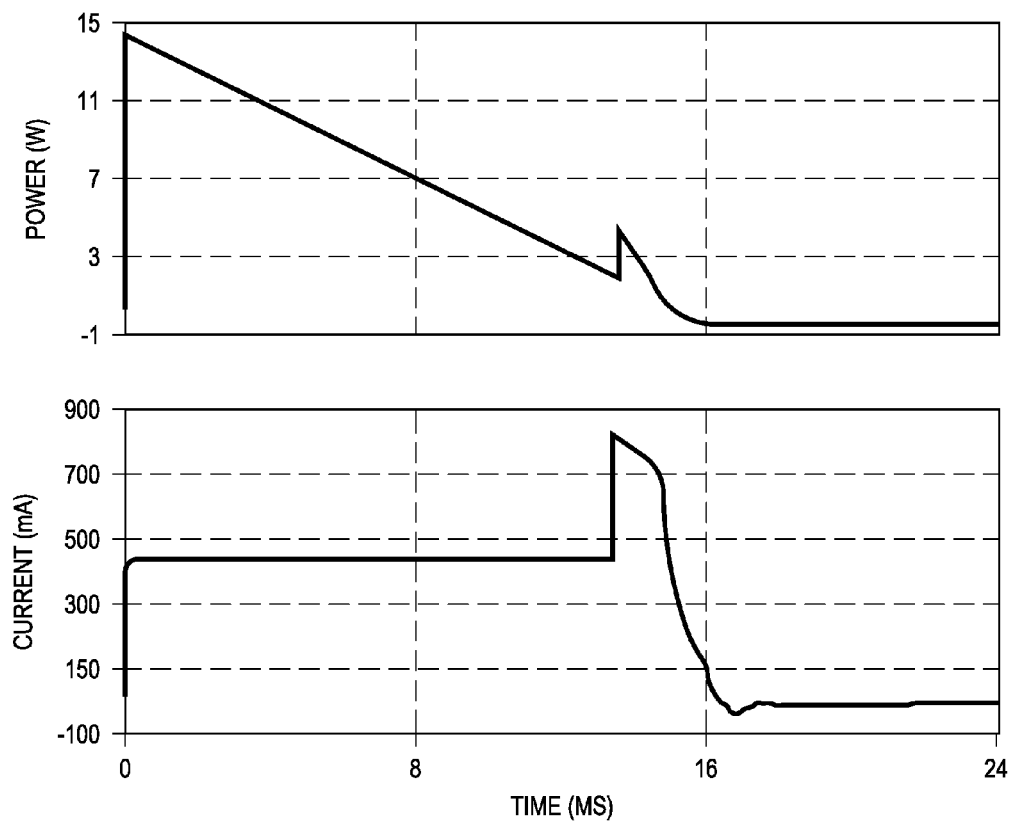

APPARATUS FOR CHARGING AN EXTERNAL CAPACITOR

TECHNICAL FIELD

The invention relates generally to a circuit for charging and, more particularly, to circuit for controlling high voltage switches.

BACKGROUND

Referring to FIG. 1 of the drawings, the reference numeral 100 generally designates a conventional charging circuit. This charging circuit 100 generally comprises a high voltage switch Q1 (which is generally a high voltage PMOS transistor) that is controlled by a control signal CNTL so as to provide current to the external capacitor CEXT from a voltage source VSUP1. Typically, the power ($P_{Q1}$) in the switch Q1 and the time ($\tau$) for charging are as follows:

$$P_{Q1} = V_{DSQ1} * I_{Q1}; \text{ and} \quad (1)$$

$$\tau = CEXT * VSUP1 / I_{Q1}, \quad (2)$$

where $V_{DSQ1}$ is the drain-source voltage of switch Q1 and $I_{Q1}$ is the current through switch Q1. Thus, as an example, if one were to assume that the external capacitor CEXT is 1 mF with a voltage source VSUP1 of 32V and a current $I_{Q1}$ of 1.5 A, then the time $\tau$ would be 21 ms, and the power $P_{Q1}$ would be 48 W. Additionally, for this application, the area of switch Q1 associated with an ON resistance of 0.5Ω can have a temperature increase of about 60° C. for 5 W of power $P_{Q1}$. These high temperatures or hot spots may cause unexpected thermal shutdown or cause damage to the device. Therefore, circuit 100 has an undesirable configuration due to susceptibility to high temperatures.

Turning to FIG. 2A, another conventional charging circuit 200 can be seen. Circuit 200 generally comprises switches Q2-1 to Q2-N that are coupled to in parallel to one another between voltage source VSUP1 and external capacitor CEXT so as to reduce the current load on each of the switches Q2-1 to Q2-N. Each of these switches Q2-1 to Q2-N is coupled to and controlled by a respective high voltage inverter level shifter 202-1 to 202-N (which are each coupled voltage source VSUP2).

Level shifters 202-1 to 202-N (hereinafter referred to a 202) can be seen in greater detail in FIG. 2B. Level shifter 202 generally comprises of a low voltage PMOS transistor Q3, high voltage PMOS transistors Q4 and Q6, high voltage NMOS transistors Q5 and Q7, and inverter 204. When the control signal CNTL is logic low or "0", transistors Q3 and Q7 are activated (while transistor Q5 is deactivated) so as to deactivate transistor Q6 and couple node N2 to ground. Alternatively, when the control signal CNTL is logic high or "1", transistors Q3 and Q7 are deactivated (while transistor Q5 is activated) so as to activate transistor Q6 and couple node N2 to the voltage source VSUP2. Additionally, in operation, when control signal CNTL is logic high, transistor Q4 operates to limit the voltage on node N1 to prevent oxide breakdown of transistor Q6 when activated.

As can be easily seen from FIG. 2B, level shifter 202 occupies a considerable amount of area, and with an array of level shifters (as shown in FIG. 2A), the area usage may be prohibitively large. High voltage switch Q1 is used as a "high side device" with a low ON resistance in native mode and re-used as a charging switch in charging mode. Moreover, because switches Q2-1 to Q2-N are activated simultaneously (or nearly simultaneously) in charging mode, there are very tight delay matching requirements that can result in a very challenging layout in native mode of operation. One more thing to consider is, if the delays are not matched, the rise/fall times of the switch may not be optimal. This configuration also needs additional control signals from the digital logic. Thus, circuit 200 is undesirable.

Therefore, there is a need for charging circuitry that does not have the drawbacks of conventional charging circuitry.

Some other conventional circuits are: U.S. Pat. No. 5,909, 135; U.S. Pat. No. 6,441,681; U.S. Patent Pre-Grant Publ. No. 2005/0068089; and U.S. Patent Pre-Grant Publ. No. 2009/0085615.

SUMMARY

A preferred embodiment of the present invention, accordingly, provides an apparatus. The apparatus comprises an output node; a first voltage source; a first switch that receives a current from the first voltage source and that is coupled to the output node, wherein the switch has a control electrode; a current sensor that is coupled to the first switch so as to measure the current and that is coupled to the control electrode of the first switch; a second voltage source; a current source that is coupled to the second voltage source; a resistor that is coupled between the current source and the control electrode of the first switch; a second switch that is coupled to the second voltage source and the control electrode of the first switch, wherein the second switch has a control electrode; and a controller that is coupled to the control electrode of the second switch.

In accordance with a preferred embodiment of the present invention, the second switch is a PMOS transistor.

In accordance with a preferred embodiment of the present invention, the controller is a one-shot.

In accordance with a preferred embodiment of the present invention, the current sensor further comprises: a sense resistor that is coupled between the first voltage source and the first switch; and an amplifier that is coupled across the sense resistor so as to receive the voltage drop across the sense resistor and that is coupled to the control electrode of the first switch.

In accordance with a preferred embodiment of the present invention, the amplifier has a first gain when the voltage on the output node is less than a predetermined voltage and has a second gain for predetermined period once the voltage on the output node is greater than the predetermined voltage.

In accordance with a preferred embodiment of the present invention, the first switch is an NMOS transistor.

In accordance with a preferred embodiment of the present invention, the apparatus further comprises a capacitor that is coupled to the output node.

In accordance with a preferred embodiment of the present invention, the current sensor further comprises: a sense transistors that receives the current from the first voltage source and that is coupled to the output node; a sense resistor that is coupled between the first voltage source and the sense transistor; and an amplifier that is coupled across the sense resistor so as to receive the voltage drop across the sense resistor and that is coupled to the control electrode of the first switch.

In accordance with a preferred embodiment of the present invention, an apparatus is provided. The apparatus comprises an output node; a first voltage source; a first switch that receives a current from the first voltage source and that is coupled to the output node, wherein the switch has a control electrode; a current sensor that is coupled to the first switch so as to measure the current and that is coupled to the control electrode of the first switch, wherein the current sensor includes a sense amplifier having: a pair of input resistors, wherein the input resistors have approximately the same resistance; a current mirror that is coupled to each of the input resistors; a pair of biasing transistors, wherein each biasing transistor is coupled to the current mirror; an output transistor having a first passive electrode, a second passive electrode, and a control electrode, wherein the first passive electrode of the output transistor is coupled to at least one of the input resistors, and wherein the control electrode of the output transistor is coupled to the current mirror; and a variable resistor that is coupled to the second passive electrode of the output transistor; a second voltage source; a current source that is coupled to the second voltage source; a resistor that is coupled between the current source and the control electrode of the first switch; a second switch that is coupled to the second voltage source and the control electrode of the first switch, wherein the second switch has a control electrode; and a controller that is coupled to the control electrode of the second switch.

In accordance with a preferred embodiment of the present invention, the current sensor further comprises a sense resistor that is coupled between the first voltage source and the first switch, and wherein the amplifier is coupled across the sense resistor so as to receive the voltage drop across the sense resistor and that is coupled to the control electrode of the first switch.

In accordance with a preferred embodiment of the present invention, the current sensor further comprises a sense transistors that receives the current from the first voltage source and that is coupled to the output node; and a sense resistor that is coupled between the first voltage source and the sense transistor, and wherein the amplifier that is coupled across the sense resistor so as to receive the voltage drop across the sense resistor and that is coupled to the control electrode of the first switch.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a transient response for the circuit of FIGS. 3A and 3B.

DETAILED DESCRIPTION

Figure 1:
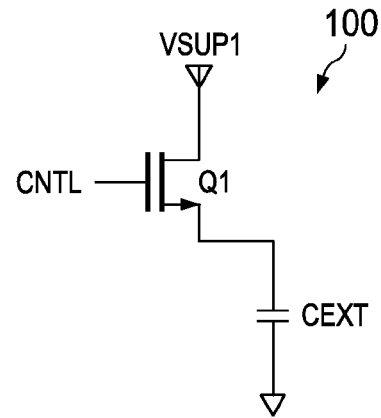
FIG. 1 is a circuit diagram of an example of a conventional charging circuit.
Figure 2A:
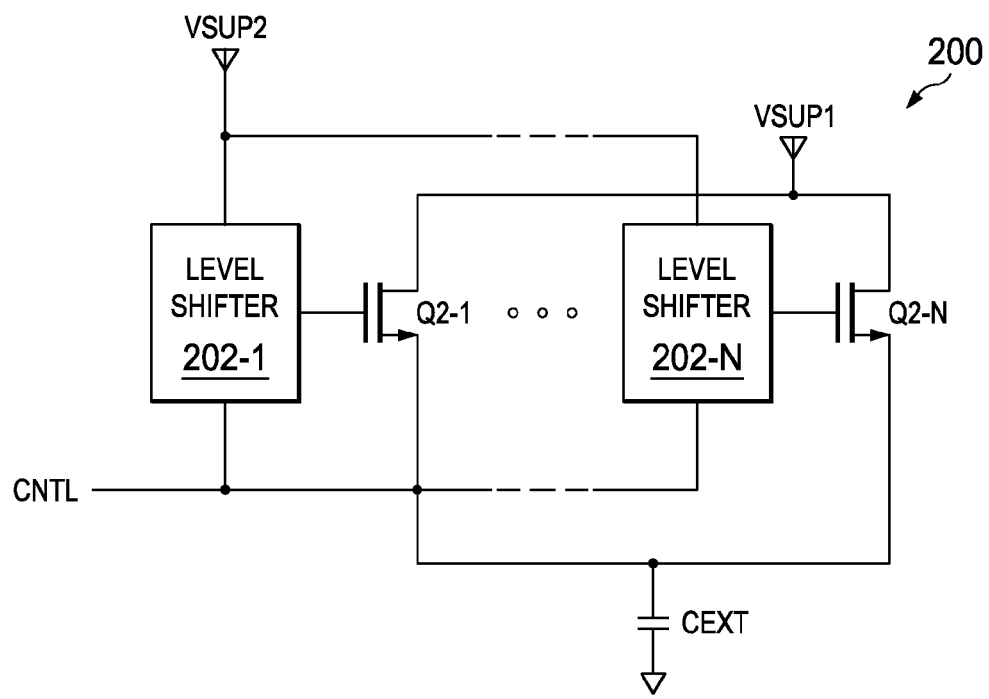
FIGS. 2A and 2B are circuit diagrams of another example of a conventional charging circuit.
Figure 2B:
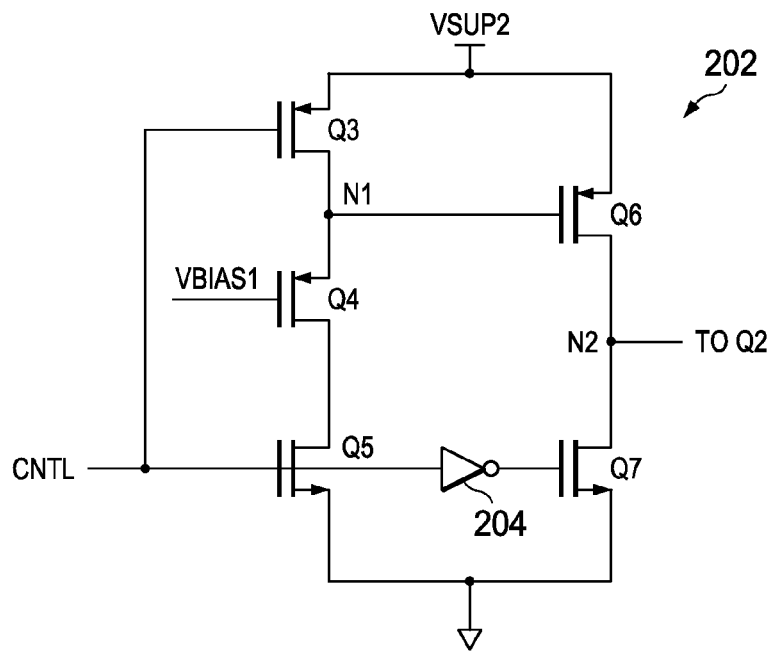

Refer now to the drawings wherein depicted elements are, for the sake of clarity, not necessarily shown to scale and wherein like or similar elements are designated by the same reference numeral through the several views.

Figure 3A:
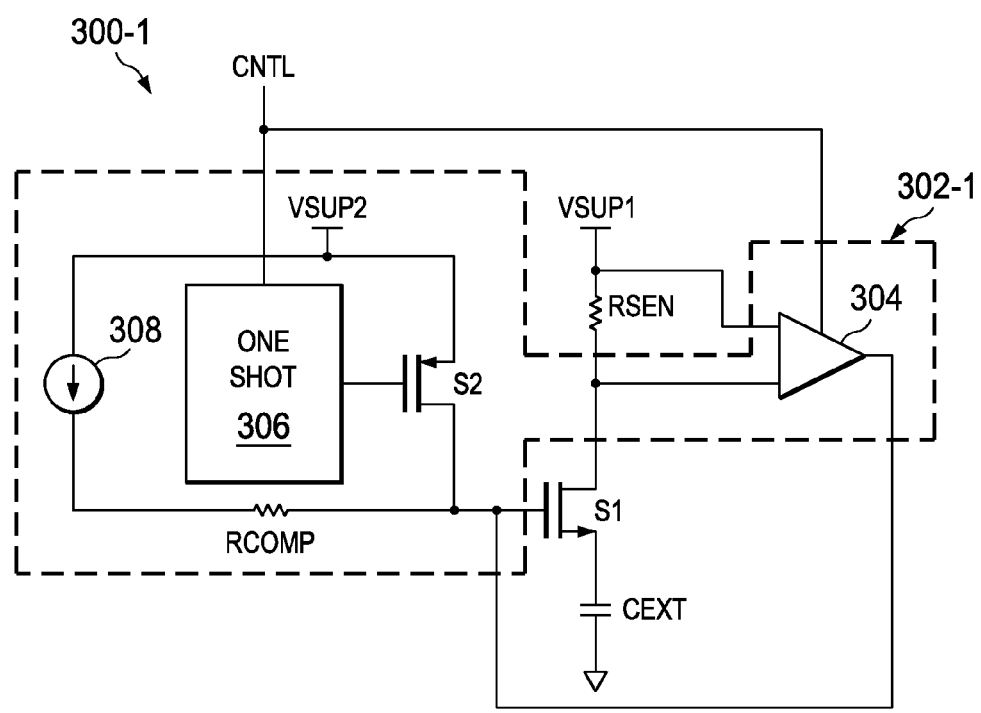
FIGS. 3A and 3B are circuit diagrams of examples of a charging circuit in accordance with a preferred embodiment of the present invention.

Turning to FIG. 3A, a charging circuit 300-1 in accordance with a preferred embodiment of the present invention can be seen. Circuit 300 generally comprises switch S1 (which is generally a high voltage NMOS transistor), resistor RSEN, and driver 302-1. Drivers 302-1 generally comprise of an amplifier 304, a switch S2, a one-shot 306, a current source 308, and a resistor RCOMP. In operation, circuit 300-1 (and more particularly driver 302-1) re-uses the normal mode current loop. Generally, a current from current source 308 (through resistor RCOMP that slows down the loop) is provided to the gate of switch S1 so as to control switch S1 and allow current to pass to capacitor CEXT. Amplifier 304 in conjunction with resistor RSEN operates as a current sensor to detect the current traversing switch S1. Preferably, the voltage drop across resistor RSEN is amplified by amplifier 304 and provided to the gate of switch S1.

In addition to this loop, driver 302-1 employ a dual slope mechanism that varies the current limit of switch S1. With the dual slope mechanism, driver 302-1 employs two phases within a charging cycle. During the first phase, a low current limit is employed until a predetermined voltage on the capacitor CEXT is reached. Driver 302-1 can accomplish this by setting the gain of its amplifier 304 to have an initial gain, resulting in a generally constant current that can be seen in FIG. 5. Once this predetermined voltage level on capacitor CEXT has been reached, drivers 302-1 and 302-2 enters the second phase, where a current limit can be based on percentage of output voltage or fixed time to achieve a required total charging time. Preferably, the current limit is increased by decreasing the gain of its amplifier 304 for a predetermined time period until the output voltage on capacitor CEXT reaches its final value. Typically, the current limit is increased to a value that is needed to achieve the required charging time and satisfying the safe operating area criterion. This causes an increase in current, as can be seen in FIG. 5. It should also be noted that increasing the current limit beyond the predetermined voltage will generally not increase the power very much (as shown in FIG. 5) because the source-drain voltage of switch S1 is lower during the second phase.

At the end of the charge cycle, the one-shot 306 (which operates as a controller) provides a strong or large amplitude pulse to the gate of switch S2. This strong pulse generally ensures the minimum ON resistance (between the drain and source) of switch S1, effectively shutting off switch S1. After the capacitor is fully charged, the switch will be in a linear mode of operation and any need to replenish charge on the capacitor can be provided with minimum time and power.

Figure 3B:
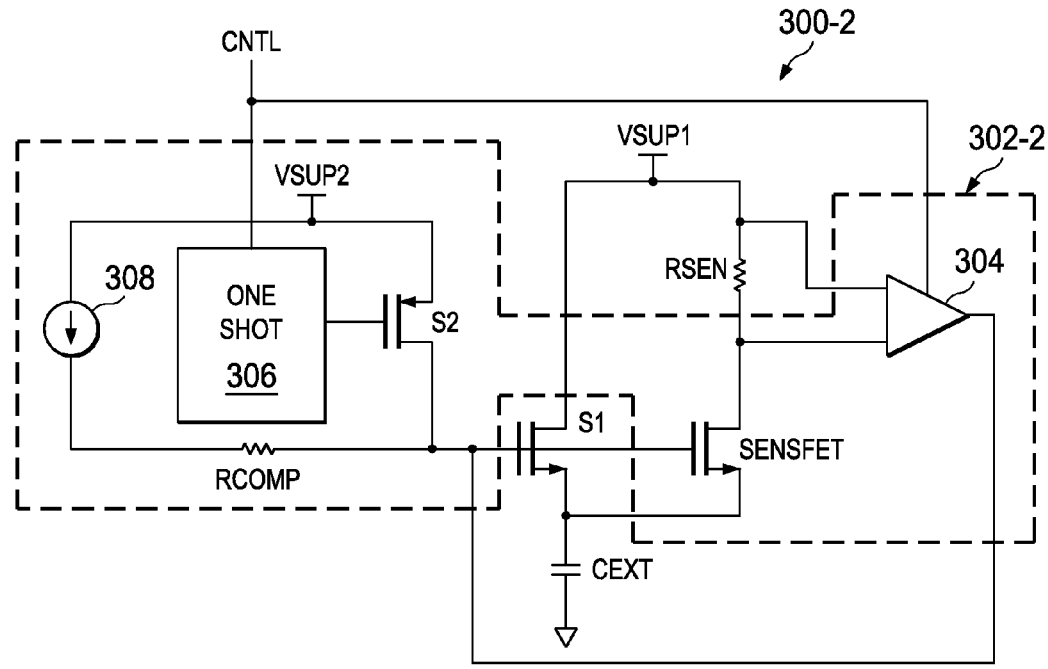

Turning to FIG. 3B, an alternative charging circuit 300-2 can be seen. A difference between charging circuits 300-1 and 300-2 lies in a difference between drivers 302-1 and 302-2. Namely, the sense resistor RSEN is removed from the path of switch S1. A reason for this is that switch S1 can require a low impedance path from voltage source VSUP1, but in order to maintain the same general functionality a sense transistor SENSEFET is coupled in series with resistor RSEN (which is generally in parallel to switch S1). Transistor SENSEFET is generally scaled in comparison to switch S1 so as to generate a replica of the current through switch S1.

Figure 4:
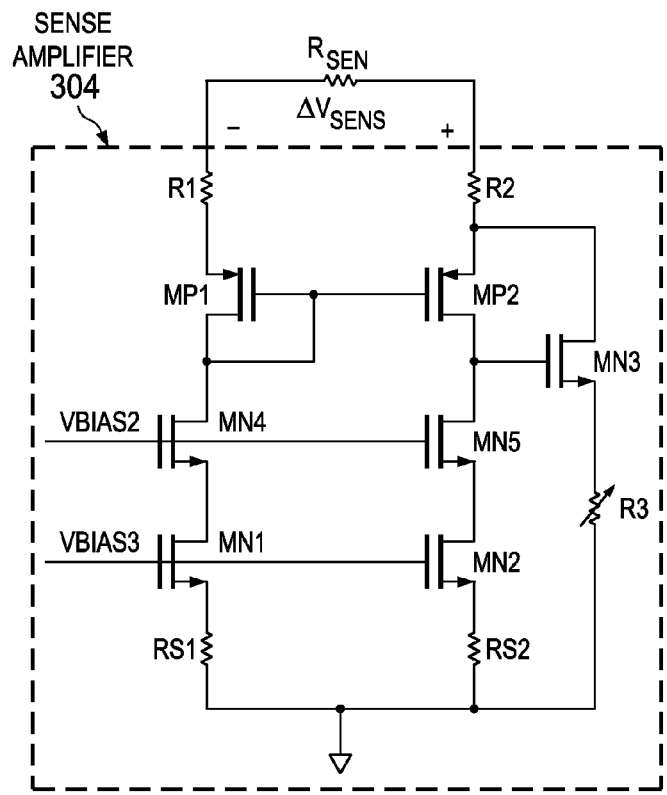
FIG. 4 is an example of a sense amplifier that can be used with the charging circuits of FIG. 3A or 3B.

Looking now to FIG. 4, sense amplifier 304 can be seen. This sense amplifier 304 generally allows the current loop of the charging circuit 300-1 or 300-2 to have a wider gain range, which generally compensates or corrects for offsets. Sense amplifier 304 generally comprises resistors R1, R2, RS1, and RS2, a current mirror MP1 and MP2 (which are generally PMOS transistors), biasing transistors MN1, MN2, MN4, and MN5 (which are generally NMOS transistors), output transistor MN3 (which is generally an NMOS transistor), and variable resistor R3. Because resistors R1 and R2 generally have the same resistance, the gain of amplifier 402 is generally a ratio of the resistances of variable resistors R3 and resistor R1, allowing the gain to be varied with the resistance of variable resistor R3. In operation, offset is generally dominated by mismatches between transistors MP1/MP2, MN1/MN2, or MN4/MN5 and is generally aggravated when the voltage drop ΔVSENS across the sense resistor RSEN is low. Thus, careful layout of transistors MP1, MP2, MN1, MN2, MN4, and MN5 in addition to varying resistor R3 can reduce the affect of offsets.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an output node;
   a first voltage source;
   a first switch that receives a current from the first voltage source and that is coupled to the output node, wherein the switch has a control electrode;
   a current sensor that is coupled to the first switch so as to measure the current and that is coupled to the control electrode of the first switch;
   a second voltage source;
   a current source that is coupled to the second voltage source;
   a resistor that is coupled between the current source and the control electrode of the first switch;
   a second switch that is coupled to the second voltage source and the control electrode of the first switch, wherein the second switch has a control electrode; and
   a controller that is coupled to the control electrode of the second switch.

2. The apparatus of claim 1, wherein the second switch is a PMOS transistor.

3. The apparatus of claim 2, wherein the controller is a one-shot.

4. The apparatus of claim 3, wherein the current sensor further comprises:
   a sense resistor that is coupled between the first voltage source and the first switch; and
   an amplifier that is coupled across the sense resistor so as to receive the voltage drop across the sense resistor and that is coupled to the control electrode of the first switch.

5. The apparatus of claim 4, wherein the amplifier has a first gain when the voltage on the output node is less than a predetermined voltage and has a second gain for predetermined period once the voltage on the output node is greater than the predetermined voltage.

6. The apparatus of claim 5, wherein the first switch is an NMOS transistor.

7. The apparatus of claim 6, wherein the apparatus further comprises a capacitor that is coupled to the output node.

8. The apparatus of claim 3, wherein the current sensor further comprises:
   a sense transistors that receives the current from the first voltage source and that is coupled to the output node;
   a sense resistor that is coupled between the first voltage source and the sense transistor; and
   an amplifier that is coupled across the sense resistor so as to receive the voltage drop across the sense resistor and that is coupled to the control electrode of the first switch.

9. The apparatus of claim 8, wherein the amplifier has a first gain when the voltage on the output node is less than a predetermined voltage and has a second gain for predetermined period once the voltage on the output node is greater than the predetermined voltage.

10. The apparatus of claim 9, wherein the first switch is an NMOS transistor.

11. The apparatus of claim 10, wherein the apparatus further comprises a capacitor that is coupled to the output node.

12. An apparatus comprising:
    an output node;
    a first voltage source;
    a first switch that receives a current from the first voltage source and that is coupled to the output node, wherein the switch has a control electrode;
    a current sensor that is coupled to the first switch so as to measure the current and that is coupled to the control electrode of the first switch, wherein the sense resistor includes a sense amplifier having:
       a pair of input resistors, wherein the input resistors have approximately the same resistance;
       a current mirror that is coupled to each of the input resistors;
       a pair of biasing transistors, wherein each biasing transistor is coupled to the current mirror;
       an output transistor having a first passive electrode, a second passive electrode, and a control electrode, wherein the first passive electrode of the output transistor is coupled to at least one of the input resistors, and wherein the control electrode of the output transistor is coupled to the current mirror; and
       a variable resistor that is coupled to the second passive electrode of the output transistor;
    a second voltage source;
    a current source that is coupled to the second voltage source;
    a resistor that is coupled between the current source and the control electrode of the first switch;
    a second switch that is coupled to the second voltage source and the control electrode of the first switch, wherein the second switch has a control electrode; and
    a controller that is coupled to the control electrode of the second switch.

13. The apparatus of claim 12, wherein the second switch is a PMOS transistor.

14. The apparatus of claim 13, wherein the controller is a one-shot.

15. The apparatus of claim 14, wherein the current sensor further comprises a sense resistor that is coupled between the first voltage source and the first switch, and wherein the amplifier is coupled across the sense resistor so as to receive the voltage drop across the sense resistor and that is coupled to the control electrode of the first switch.

16. The apparatus of claim 15, wherein the amplifier has a first gain when the voltage on the output node is less than a predetermined voltage and has a second gain for predetermined period once the voltage on the output node is greater than the predetermined voltage.

17. The apparatus of claim 16, wherein the first switch is an NMOS transistor.

18. The apparatus of claim 17, wherein the apparatus further comprises a capacitor that is coupled to the output node.

19. The apparatus of claim 14, wherein the current sensor further comprises:
- a sense transistors that receives the current from the first voltage source and that is coupled to the output node; and
- a sense resistor that is coupled between the first voltage source and the sense transistor, and wherein the amplifier that is coupled across the sense resistor so as to receive the voltage drop across the sense resistor and that is coupled to the control electrode of the first switch.

20. The apparatus of claim 19, wherein the amplifier has a first gain when the voltage on the output node is less than a predetermined voltage and has a second gain for predetermined period once the voltage on the output node is greater than the predetermined voltage.

21. The apparatus of claim 18, wherein the first switch is an NMOS transistor.

22. The apparatus of claim 21, wherein the apparatus further comprises a capacitor that is coupled to the output node.

* * * * *